(12) United States Patent
Szilagi et al.

(10) Patent No.: US 6,785,150 B1
(45) Date of Patent: Aug. 31, 2004

(54) METHOD AND APPARATUS FOR PREVENTING WARPAGE OF PRINTED CIRCUIT BOARDS

(75) Inventors: Tomany Szilagi, Felton, CA (US); Douglas P. Gibbs, Yuba City, CA (US)

(73) Assignee: Arcwave, Inc., Campbell, CA (US)

( * ) Notice: Subject to any disclaimer, the term of this patent is extended or adjusted under 35 U.S.C. 154(b) by 0 days.

(21) Appl. No.: 10/282,553

(22) Filed: Oct. 28, 2002

(51) Int. Cl.[7] .............................................. H05K 7/02
(52) U.S. Cl. ..................... 361/810; 361/759; 211/41.17
(58) Field of Search .................................. 361/719, 810, 361/825, 748, 759, 801, 802, 726, 727; 174/138 G; 211/41.17; 313/223.1

(56) References Cited

U.S. PATENT DOCUMENTS

| | | | | |
|---|---|---|---|---|
| 4,339,628 A | * | 7/1982 | Marcantonio et al. ..... | 174/35 R |
| 4,739,452 A | * | 4/1988 | Fukunaga ................... | 361/756 |
| 4,811,168 A | * | 3/1989 | Chesnut et al. ............. | 361/752 |
| 5,270,692 A | * | 12/1993 | Rockwell .................... | 345/163 |
| 5,615,085 A | * | 3/1997 | Wakabayashi et al. ...... | 361/702 |
| 5,894,408 A | * | 4/1999 | Stark et al. .................. | 361/704 |
| 6,418,028 B2 | * | 7/2002 | Nariyama .................... | 361/759 |
| 6,449,153 B1 | * | 9/2002 | James ......................... | 361/704 |

* cited by examiner

*Primary Examiner*—David Martin
*Assistant Examiner*—Thanh S. Phan
(74) *Attorney, Agent, or Firm*—Glenn Patent Group; Michael A. Glenn

(57) ABSTRACT

A method and apparatus are provided for preventing warpage of printed circuit boards (PCBs) for the purpose of maintaining proper shape and alignment. A PCB is placed on a base of matching shape and slightly larger size. The PCB is secured to the base by a single fastener, preferably through approximately its center. Inwardly curving brackets are mounted along the outer edges of the base in such a way that their central portions rest on top of the PCB. The brackets are constructed of a solid yet flexible non-conducive material and are fastened to the base and, optionally, to each other. The PCB placed in between the base and the brackets is able to expand without warping significantly. This method is especially effective when used to maintain the shape and alignment of the PCB for an antenna.

12 Claims, 8 Drawing Sheets

METHOD AND APPARATUS FOR PREVENTING WARPAGE OF PRINTED CIRCUIT BOARDS

BACKGROUND OF THE INVENTION

1. Field of the Invention

The present invention relates generally to the prevention of deformities in circuit boards, such as printed circuit boards, and more specifically to preventing warpage in printed circuit boards in antennas.

2. Description of the Related Art

In printed circuit boards (PCBs), integrated circuits, active components, passive components, and wiring are formed and/or placed onto one or both sides of an insulating base according to a predetermined pattern. Such PCBs are found in countless types of electronic equipment, running everything from portable radios to immense supercomputers. Sophisticated boards may contain several layers of wiring to enable complex connectivity between the various components.

Boards are manufactured from a variety of board materials. The most commonly used material is a composition of glass fabrics or fibers bonded with epoxy resins. Other compositions used are made up of various other materials such as aramid fibers and polymide or polytetrafluoroethylene resins. However, these materials have been known to expand when subjected to heat from, for example wave soldering or exposure to the elements. In addition, such materials may be chipped or dropped and broken while being handled. Any such deformity may cause an electrical device to stop functioning properly. The problem of PCB warpage, or bending, is experienced in both the manufacture and use of PCBs. Since in most cases PCBs are secured in place (by pins or screws placed at the boards edges for example), any expansion will cause the board to bend or warp. Devices such as antennas, which are constantly exposed to the elements, are especially susceptible to this problem. Moreover, in the case of an antenna, any PCB warpage can potentially prevent the antenna from being able to receive transmissions properly, since the proper alignment and shape of the PCB is often essential to the antenna's proper function.

Typically, the problem of PCB warpage or bending is dealt with by providing "board stiffeners", which are rigid in a direction generally perpendicular to the plane of the board. The fundamental nature of these separate board stiffeners is to act as common mechanical support members secured to the board, much like beams in the shape of an "I"(I-beams) or "L"(L-beams) in larger mechanical structures. Board stiffeners are installed at selected locations, generally both longitudinally and crosswise, to ensure that the board remains planar. A typical board stiffener comprises an elongated metallic bar which is mounted in a fixed relationship onto the upper or bottom surface of the board. To securely affix the stiffener to the board in an appropriate position, typical installation makes use of a conventional fastening technique, such as riveting or soldering, at a plurality of locations on the board. In most cases, the stiffener is constructed of an electrically conductive material. This allows the board stiffener to function as a power distributor or as a common electrical ground for a portion of the circuitry embodied within the board, in addition to providing a mechanical function. There are many different board stiffener structures, such as grooved wrap-around frames. A grooved wrap-around frame is a frame that supports the entire perimeter of a PCB with engaging tabs that fit through the PCB, and are bent over on the opposite side of the board.

However, in many cases, the board stiffeners themselves or indeed the entire casing of an electronic device, may be subject to the same aforementioned distortions and deformations. These may result in stress-induced warpage of a PCB.

Another solution is to provide PCBs that have low expansion factors, leading to reduced likelihood of PCB warpage. These warp-resistant PCBs, however, tend to be more expensive than typical PCBs.

It would be advantageous to have a method and apparatus that would significantly reduce PCB warpage. It would also be advantageous to provide solutions to maintain proper PCB alignment and shape in an antenna despite the PCBs possible expansion due to the influence of the elements. Furthermore, it would be advantageous to provide such solutions with relatively inexpensive PCBs for use in devices, such as antennas, that are exposed to the elements.

BRIEF SUMMARY OF THE INVENTION

The present invention provides a method and apparatus for holding in place a printed circuit board (PCB) so as to prevent the PCB from warping. The method entails fastening a PCB to a base structure, placing a frame over the PCB, and securing the frame to the base at a single point in the relative center of the PCB. The apparatus comprises a base to which a PCB is fastened and a frame overlaying the PCB and secured to the base.

The advantage of this invention is that a PCB may expand in the XY plane without the expansion causing the PCB to warp. Only expansion in the Z direction is substantially restricted. Also, since the PCB is allowed to expand, the PCB may be constructed of materials that are cheaper than those materials that are more resistant to warpage. Moreover, a board stiffener need not be attached to the PCB.

BRIEF DESCRIPTION OF THE DRAWINGS

Objects, features and advantages of the invention will be more readily apparent from the following detailed description of a preferred embodiment of the invention in which.

Like drawing numerals refer to corresponding parts throughout the several views of the drawings.

DETAILED DESCRIPTION OF THE INVENTION

This invention provides a method and apparatus for significantly limiting warpage of a printed circuit board (PCB), such that the PCB maintains its proper shape, form, and alignment. This is especially useful in an antenna implemented on top of a PCB, so as to ensure the antenna's proper function despite exposure to the elements.

PCBs are known to expand when exposed to heat. Therefore, attempting to hold them in place in a constant shape and size may cause them to bend or warp. The invention disclosed is a method and apparatus for allowing a PCB to expand freely in the x-y plane, thus significantly reducing PCB warpage. The invention further allows the board to maintain its relative shape, form, and alignment. This is achieved by use of a specialized apparatus, several embodiments of which are described in detail herein.

Figure 1A:
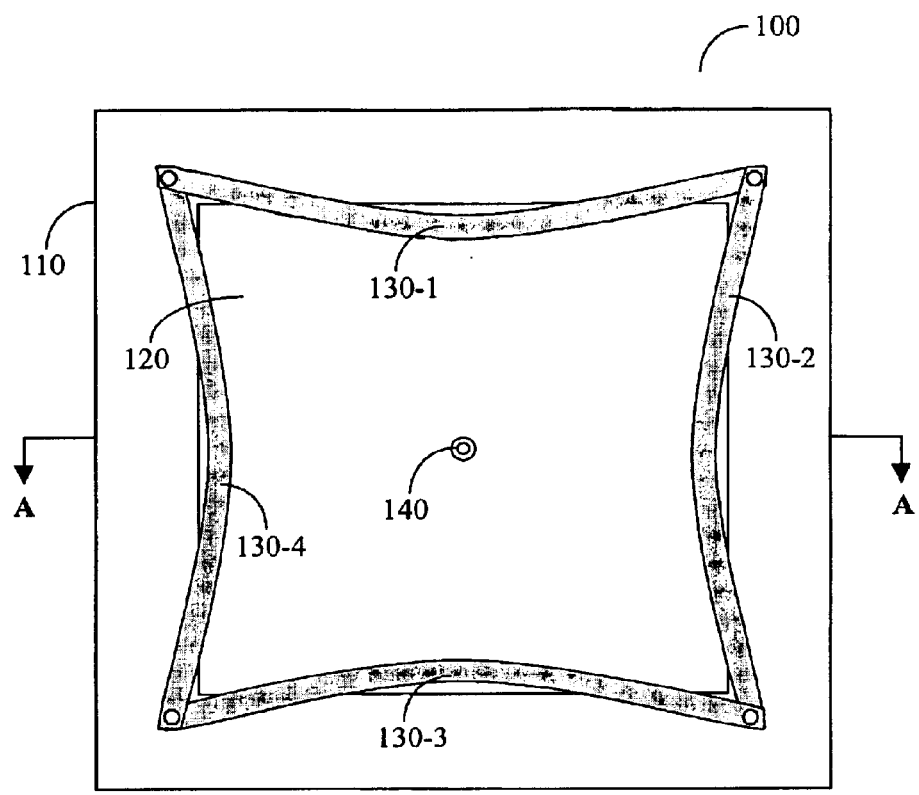
FIGS. 1A and 1B depict an exemplary embodiment of connected brackets holding a PCB.
Figure 1B:
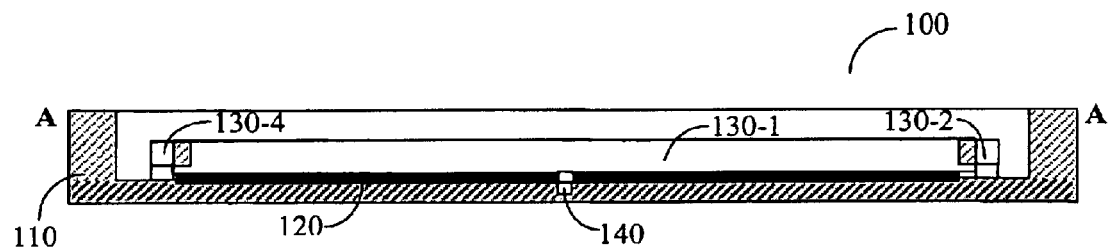

Reference is now made to FIGS. 1A and 1B where diagrams of an exemplary embodiment of the invention are provided. FIG. 1A shows a top view of apparatus 100 and FIG. 1B shows a cross-section of apparatus 100 along line A—A of FIG. 1A. FIGS. 1A and 1B show a base 110, a PCB 120, brackets 130-1 to 130-4, and a fastener 140. The PCB 120 is placed on the base 110, which supports PCB 120. The PCB 120 is secured to base 110 by a single fastener 140 through approximately the center of PCB 120. Fastener 140 may be a screw, a pin, or another fastening device capable of attaching PCB 120 to base 110. Base 110 is preferably made of a solid non-conducive material such as plastic, and is preferably of similar shape, but slightly larger than PCB 120. Alternatively, base 110 may be made of a conducting material. Brackets 130-1 through 130-4 are connected to base 110 in such a way that they are bent inward, and apply downward pressure on PCB 120.

Figure 2A:
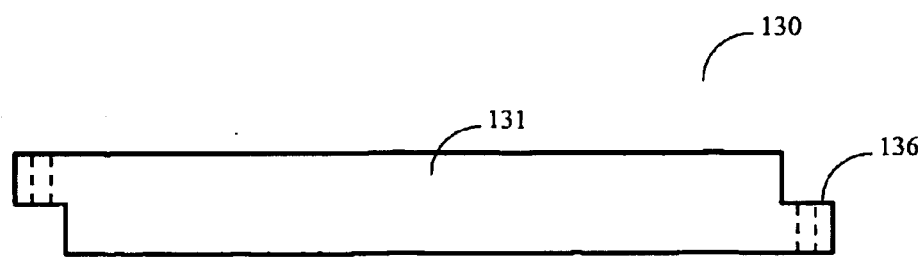
FIGS. 2A and 2B depict an exemplary bracket design.
Figure 2B:
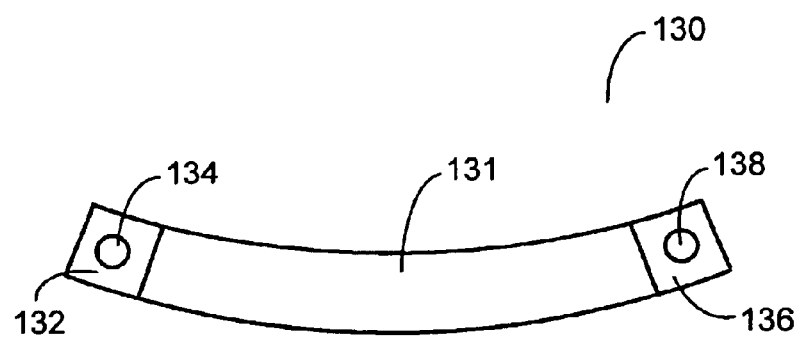

A representation of an exemplary bracket 130 is provided in FIGS. 2A and 2B wherein FIG. 2A shows a side view of bracket 130 and FIG. 2B shows a top view of bracket 130. Bracket 130 is preferably made of a solid, flexible non-conducive material. Bracket 130 preferably has a central portion 131, a first end 132 with an aperture 134 opening vertically therethrough, and a second end 136 with an aperture 138 opening vertically therethrough. The first end 132 and second end 136 are vertically displaced such that when the aperture 134 of a first bracket, e.g., 130-1, is vertically aligned with the aperture 138 of a second bracket, e.g., 130-2, the central portions 131 of the first bracket 130-1 and second bracket 130-2 are substantially horizontally aligned. The brackets are secured together by a fastener that fits through the apertures 134 and 138. The same fastener may be used to secure the brackets 130-1 and 130-2 to the base 110 (FIG. 1A).

In an alternative embodiment, a fastener (not illustrated) protrudes from base 110 while a first bracket and a second bracket are placed over the base 110 such that the protruding fastener extends through aperture 138 of the first bracket and aperture 134 of the second bracket, securing the first and second brackets to the base 110. In yet another embodiment, bracket 130 may have a fastener as part of its structure, protruding downwards from its higher edge 132. A fastener may be a screw, a pin, or another fastening device capable of connecting the bracket 130 to the base 110.

Figure 2C:
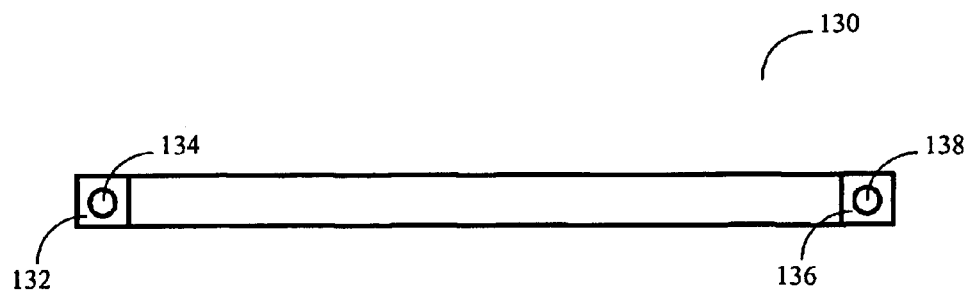
FIG. 2C depicts an alternative design.

In another embodiment shown in FIG. 2C, a bracket 130A is used instead of bracket 130. In this embodiment, only areas 139B touch the PCB 120 and thereby hold it in place. The remainder of bracket 130A has an indentation 139A that prevents that part of bracket 130A from touching the PCB 120.

Figure 3:
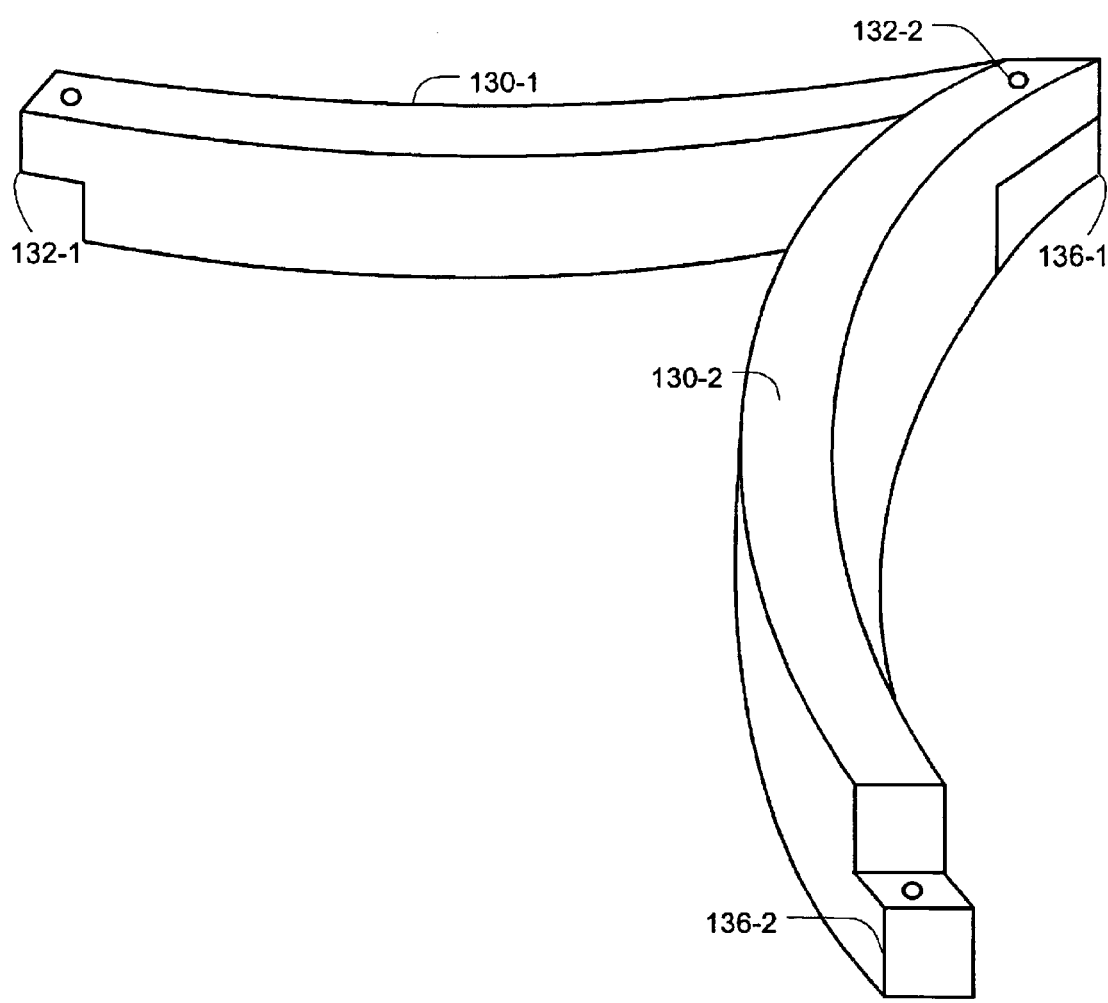
FIG. 3 depicts an example of the placement of two adjacent brackets.

FIG. 3 shows a three-dimensional rendering of an exemplary placement of two adjacent brackets 130. Bracket 130-2 is placed perpendicular to bracket 130-1, with the higher end 132-2 of bracket 130-2 placed on the lower end 136-1 of bracket 130-1. Similarly, the higher end (not illustrated) of a third bracket is placed on the lower end of bracket 130-2. A fourth bracket (not illustrated) is placed so that its higher end is on the third bracket's lower end, and its lower end is beneath the higher end 132-1 of bracket 130-1, forming a rectangular perimeter of four brackets. This method for placing the brackets preferably results in the brackets holding each other downward, thus increasing the downward pressure applied by the combined brackets. It should be noted that a rectangular shape is shown for convenience only; other shapes may be used. It should be further noted that a person skilled in the art could construct connected brackets 130 as one or more monolithic structures for use with the invention as a single bracket frame, and maintain some of the anti-warp qualities described above.

Returning to FIGS. 1A and 1B, brackets 130-1 through 130-4 are placed on base 110 around PCB 120 according to the method described above and are secured to the base by a fastener in a position that has them at least slightly bent inward towards PCB 120. This has the effect of placing the central portion of each bracket in a position that applies downward pressure on PCB 120. In essence, while PCB 120 is able to expand outward (between base 110 and brackets 130), it is denied vertical movement that would alter its relative alignment in the overall system. Since PCB 120 is able to expand freely in the x-y plane and is not physically restricted to a certain size and shape, no, or significantly reduced, PCB warpage occurs as a result of this expansion. This allows for the use of low cost PCBs for demanding applications rather than the more expensive PCBs made from materials that are more resistant to warpage.

Figure 4:
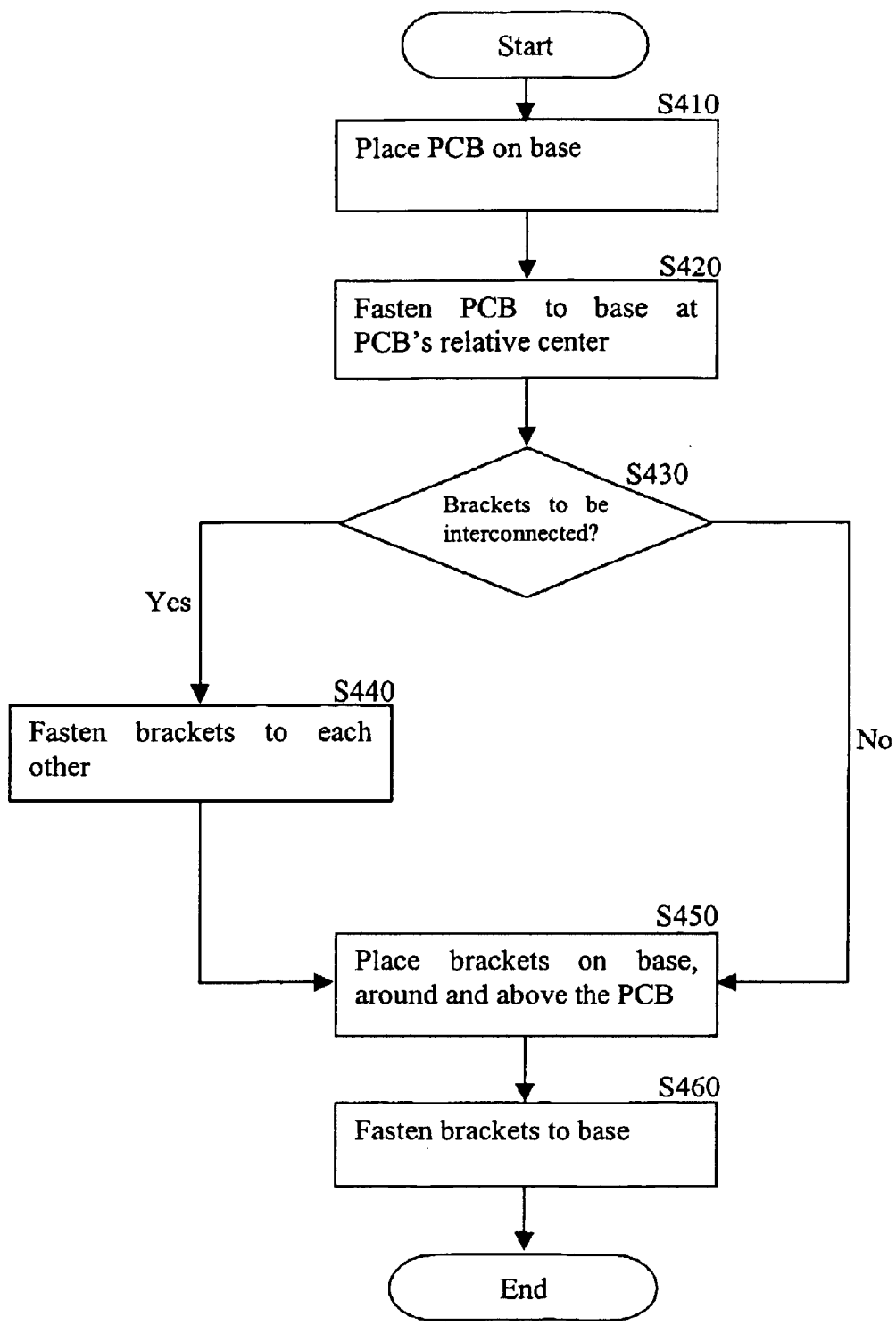
FIG. 4 depicts a flow-chart of a method for holding a PCB to a base using brackets in accordance with the disclosed invention.

Reference is now made to FIG. 4 where a flow chart is shown describing illustrative steps for securing a PCB to a base in accordance with the disclosed invention. In step S410, the PCB is placed on the base. This placement should be done such that a hole through the PCB, preferably located at approximately its center, is placed at a location on the base where a fastener can be inserted. In step S420, the PCB is fastened to the base by use of a fastener. The fastener may be a screw, pin, nail or any other type of fastener capable of securing the PCB to the base. At step S430, a determination is made whether the brackets are to be interconnected. If in step S430 it is determined that brackets are to be connected to each other, this step takes place at step S440 and the process continues to step S450; otherwise, the process continues directly to step S450. At step S450, the brackets are placed on top of the PCB; and subsequently, in step S460, the brackets are fastened to the base by using fasteners as may be necessary.

Figure 5:
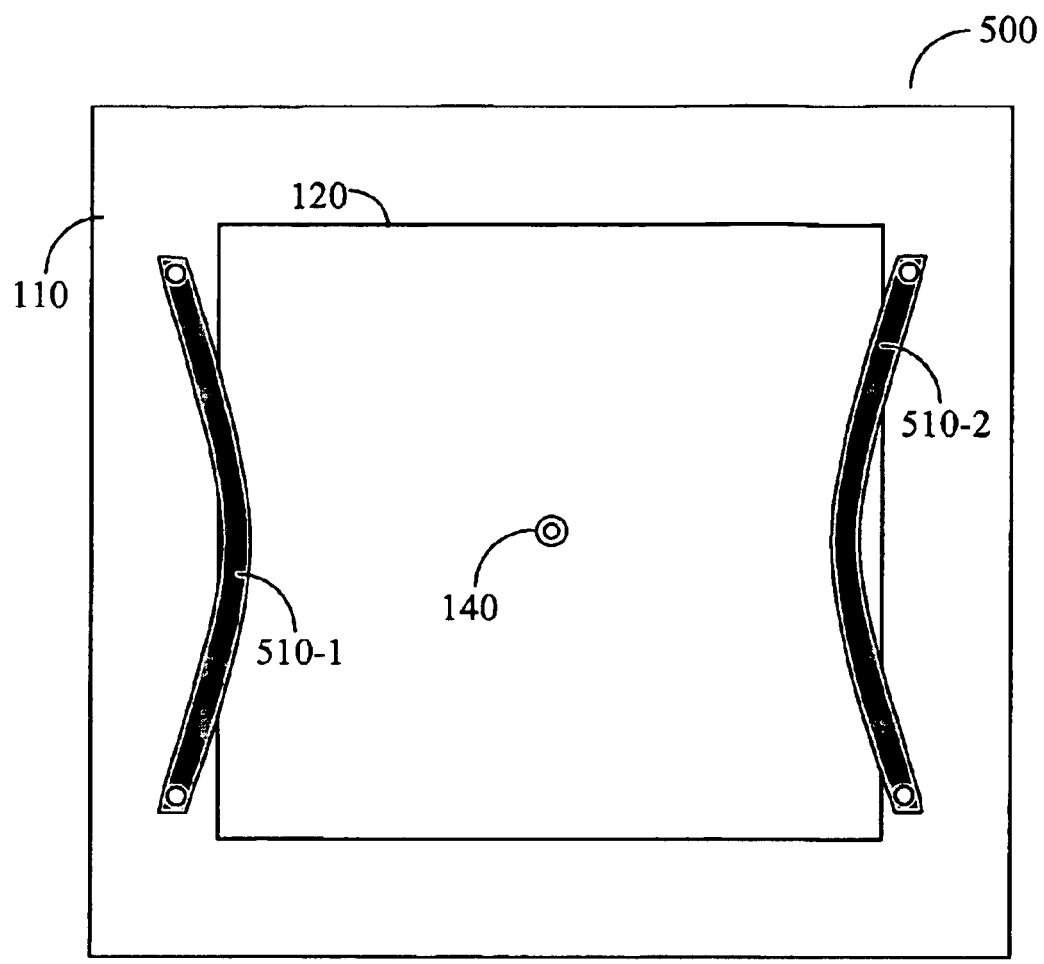
FIG. 5 depicts an exemplary embodiment of non-connected brackets holding a PCB.

In another embodiment of this invention, schematically shown in FIG. 5, downward pressure on PCB 120 is supplied by only two brackets 510-1 and 510-2 on opposite sides of the PCB that are not connected to each other. Similarly to bracket 130, brackets 510-1 and 510-2 are preferably made of a solid, flexible non-conducive material. This embodiment provides essentially the same anti-warp qualities explained above. A person skilled in the art could use any number of brackets, where the number is equal to or larger than two. Such a person could place additional non-connecting brackets on the same side as a first bracket.

Figure 6:
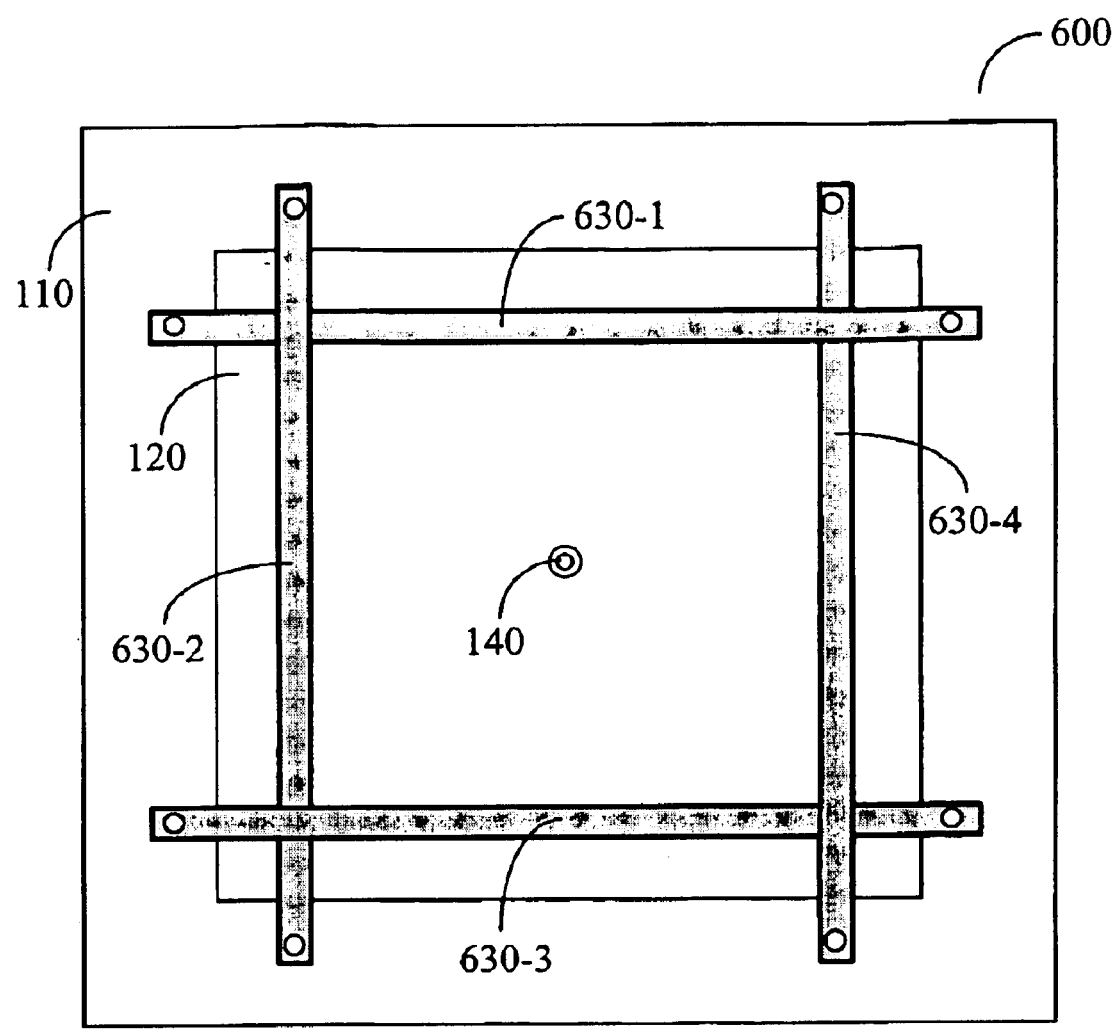
FIG. 6 depicts another exemplary embodiment of connected brackets holding a PCB.
Figure 7:
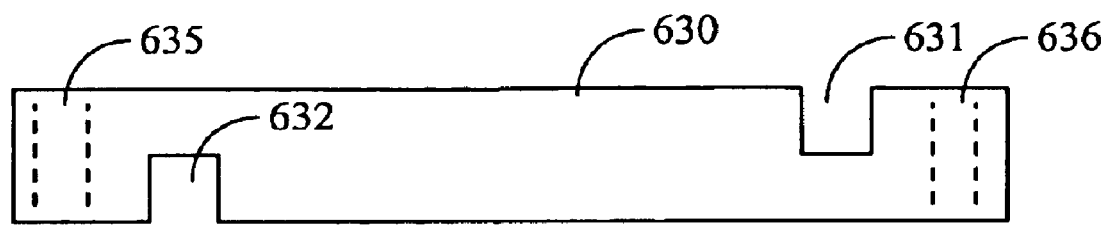
FIG. 7 depicts another exemplary bracket design.

Reference is now made to FIG. 6, where a diagram of yet another exemplary embodiment of the invention is provided. The difference between this embodiment and the one depicted in FIG. 1 is in the brackets. Brackets 630-1 through 630-4 each have two notches 631, 632 at the same locations, one on the top at one end of the bracket and the other on the bottom at the other end, as can be seen in a side view of a bracket 630 in FIG. 7. These notches facilitate the connection of the brackets to each other with a notch on the top side of one bracket mating with a notch on the bottom side of another bracket. Bracket 630 further has apertures 635, 636 at both its edges. Fasteners may be fitted through the aforementioned apertures in order to secure bracket 630 to base 110. A portion of each bracket 630 is placed on top of PCB 120. Once fastened to base 110, brackets 630-1 through 630-4 apply downward pressure on PCB 120. Thus, this embodiment also provides essentially the same anti-warp qualities described above. It should be noted that a person skilled in the art could construct any number of connected brackets 630 as a single structure for use with the invention, and maintain all of the aforementioned anti-warp qualities.

Figure 8:
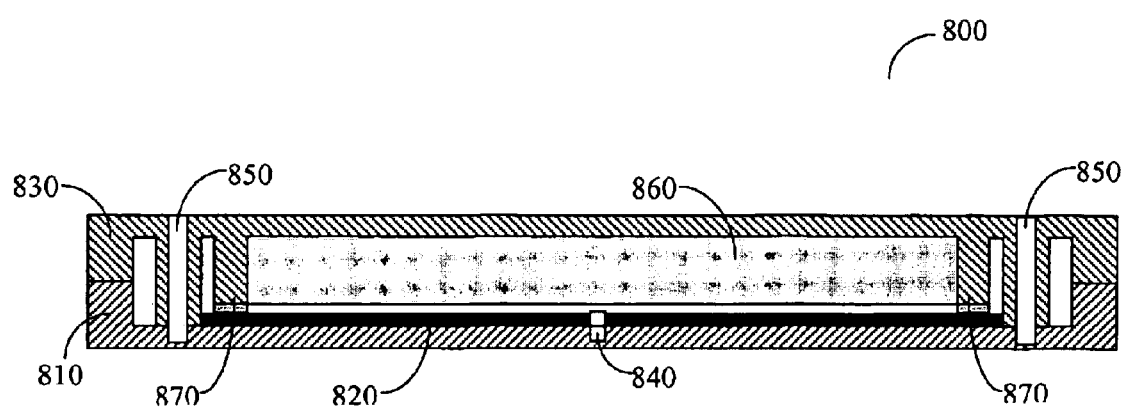
FIG. 8 depicts an exemplary embodiment of a base and top holding a PCB.

Reference is now made to FIG. 8, where a cross section of another exemplary embodiment of the invention is shown. A PCB 820 is placed on base 810 and secured to base 810 by means of a fastener through hole 840 where a corresponding hole is available through PCB 820. A top 830 is placed on base 810 and secured to base 810 with fasteners that are inserted through holes 850. The top 830 has two spaced apart parallel brackets 860 (only one of which is shown) running in one direction and two spaced apart parallel brackets 870 running in a perpendicular direction. The four brackets extend downward toward base 810 and are designed to hold PCB 820 in its planar position while allowing movement in the XY plane. As a result, the PCB 820 is essentially held floating and the structure accomplishes the desired results of avoiding warpage in the Z direction.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method of holding in place a printed circuit board (PCB) so as to prevent the PCB from warping, comprising:
    fastening the PCB at a single point, and only a said single point to a base;
    placing a frame over the PCB such that the frame applies downward force on the PCB to prevent the PCB from warping; and
    securing the frame to the base.

2. The method of claim 1, wherein the single point is at a central point of the PCB.

3. The method of claim 1, wherein the base has a surface that generally conforms to the PCB.

4. The method of claim 1, further comprising:
    coupling a plurality of brackets together to form the frame.

5. The method of claim 1, wherein said placing includes placing a plurality of brackets and said securing includes securing each bracket to the base.

6. An apparatus, comprising:
    a base;
    a PCB fastened at a single point, and only at said single point to the base; and
    a frame overlaying and engaging the PCB and secured to the base such that the frame applies downward force on the PCB to prevent the PCB from warping.

7. The apparatus of claim 6, wherein the single point is at a central point of the PCB.

8. The apparatus of claim 6, wherein the frame applies downward force on the PCB.

9. The apparatus of claim 6, wherein the base has a surface that generally conforms to the PCB.

10. The apparatus of claim 6, wherein the frame comprises a plurality of brackets.

11. The apparatus of claim 10, wherein the brackets are coupled together.

12. The apparatus of claim 10, wherein each bracket is secured to the base.

* * * * *